(12) United States Patent
Kanehira (10) Patent No.: US 6,236,215 B1
(45) Date of Patent: May 22, 2001

(54) CELL VOLTAGE DETECTION CIRCUIT, AND METHOD OF DETECTING CELL VOLTAGE

(75) Inventor: Hiroki Kanehira, Fukushima (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/250,491

(22) Filed: Feb. 16, 1999

(30) Foreign Application Priority Data

Feb. 20, 1998 (JP) .................................................. 10-039320

(51) Int. Cl.$^7$ .................................................. G01N 27/416
(52) U.S. Cl. ........................................... 324/429; 320/118
(58) Field of Search .................................... 320/116, 117, 320/118, 119, 120; 324/429

(56) References Cited

U.S. PATENT DOCUMENTS

| | | | |
|---|---|---|---|
| 5,206,578 | * 4/1993 | Nor ....................................... | 320/118 |
| 5,387,857 | * 2/1995 | Honda et al. ........................ | 320/120 |
| 5,631,537 | * 5/1997 | Armstrong ........................... | 320/118 |

* cited by examiner

Primary Examiner—Peter S. Wong
Assistant Examiner—Lawrence Luk
(74) Attorney, Agent, or Firm—Sonnenschein Nath & Rosenthal (57) ABSTRACT

A cell voltage detection circuit 20 comprises a first input selecting means 22 connected to the positive and negative electrodes of each of cells connected in series to each other to acquire a voltage from either a selected positive or negative electrode of an intended cell, a second input selecting means 24 connected to the positive and negative electrodes of each of the cells to acquire a voltage from either a selected positive or negative electrode of an intended cell, a voltage detector 30 to acquire a detected cell output voltage from output voltages of the first and second input selecting means 22 and 24, respectively, and a processing means 40 for converting a detected cell output voltage of the voltage detector 30 from analog to digital for calculation to provide the voltage of each cell.

15 Claims, 7 Drawing Sheets

CELL VOLTAGE DETECTION CIRCUIT, AND METHOD OF DETECTING CELL VOLTAGE

RELATED APPLICATION DATA

The present application claims priority to Japanese Application No. P10 039320 filed Feb. 20, 1998 which application is incorporated herein by reference to the extent permitted by law.

BACKGROUND OF THE INVENTION

1. Field of the Invention

The present invention relates to a voltage detection circuit for a plurality of cells, such as lithium ion cells or nickel cadmium cells, connected in series to each other in a battery, and to a method of detecting a cell voltage.

2. Description of Related Art

In some cases, so-called cells such as lithium ion cells or nickel cadmium cells are connected in series to each other for use as a battery pack or a battery to supply an electric power to an electronic equipment such as handy-type video tape recorder, electronic camera, portable computer or the like.

Figure 1:
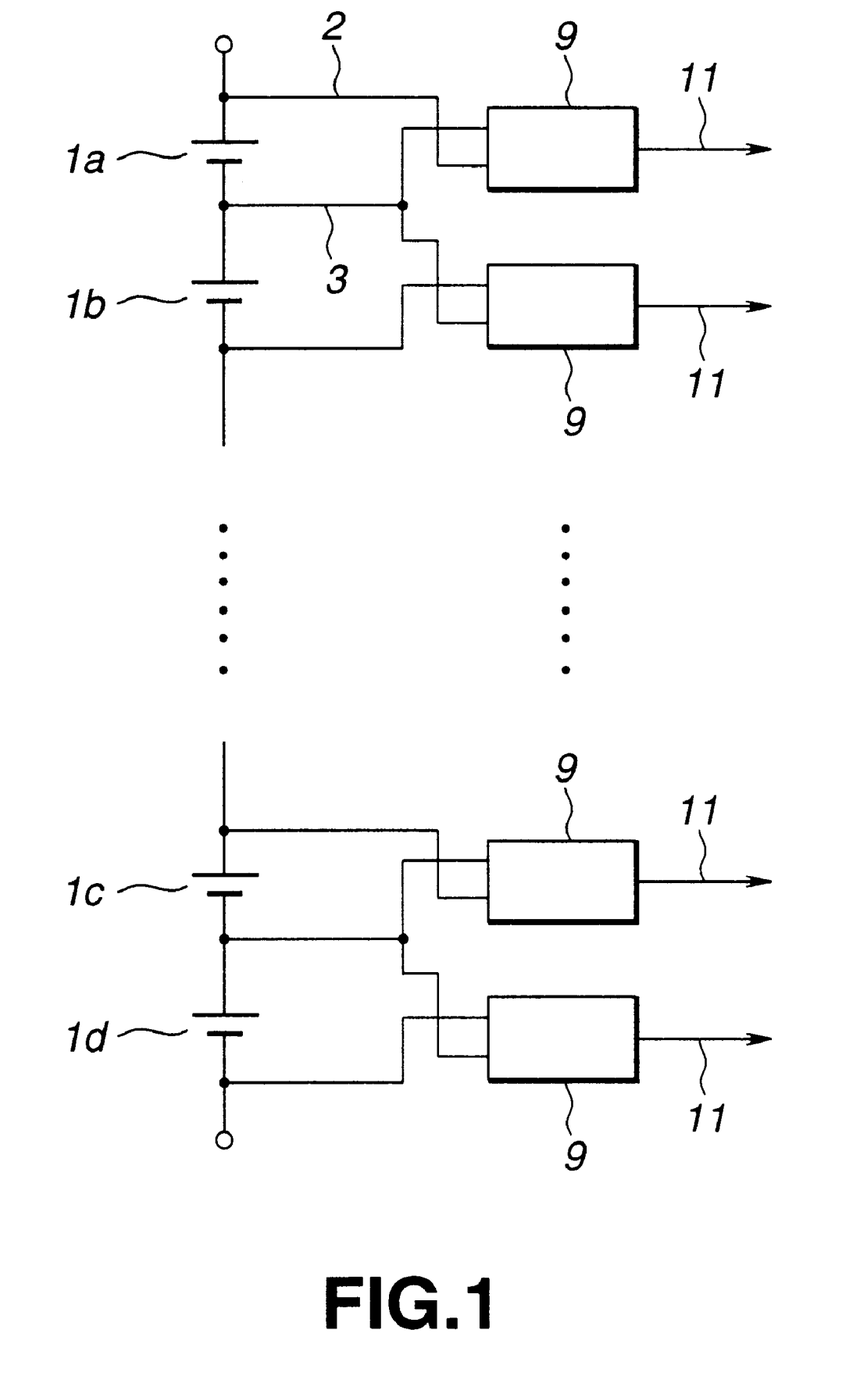
FIG. 1 is a circuit diagram of a conventional cell voltage detection circuit.
Figure 2:
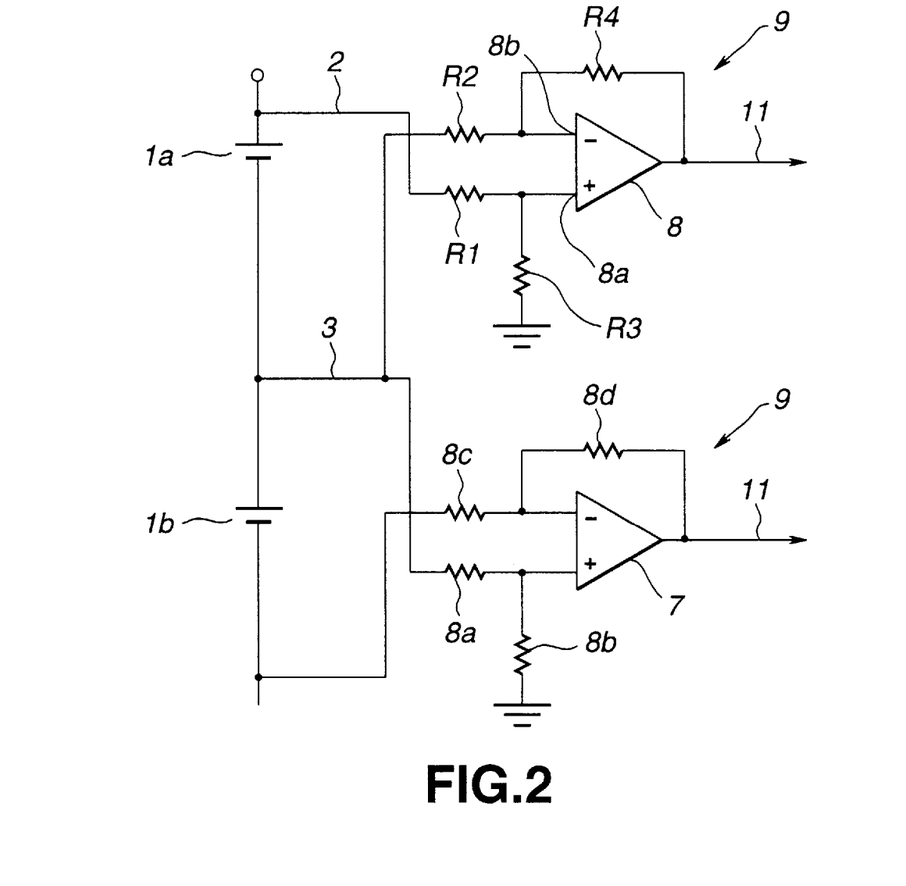
FIG. 2 is a circuit diagram of a voltage detector included in the cell voltage detection circuit in FIG. 1.

A cell is a single unit of a battery. FIG. 1 is a circuit diagram of a conventional cell voltage detection circuit. FIG. 2 shows an example in which a plurality of such cells (1 (1$a$ to 1$d$) is connected in series to each other and each of them is connected to a cell voltage detector 9. Of these cells, a one indicated with the reference 1$a$ has a highest potential, while a one indicated with the reference 1$d$ has a lowest potential.

FIG. 2 is a circuit diagram of the cell voltage detector 9 included in the cell voltage detection circuit in FIG. 1. The cell voltage detector 9 comprises an operational amplifier 8 having a noninverting terminal 8$a$ and an inverting terminal 8$b$. For example, the cell 1$a$ having the highest potential has a positive electrode thereof connected to the noninverting terminal 8$a$ of the operational amplifier 8 of the cell voltage detector 9 via a sense line 2 and resistor R1, and a negative electrode thereof connected to the inverting terminal 8$b$ of the operational amplifier 8 via a sense line 3 and resistor R2. Similarly, each of the other cells has positive and negative electrodes thereof connected to an operational amplifier 8 via a sense line and resistor. Thus, the operational amplifier 8 will detect a voltage from the corresponding cell 1 and provide it as its voltage output 11 individually.

As shown in FIG. 2, each voltage detector 9 in FIG. 1 as provided therein a plurality of resistors R1 to R4 for the operational amplifier 8.

The detecting accuracy of the cell voltage detector 9 having the above-mentioned configuration greatly depends upon the accuracy of each of the resistors R1 to R4 and that of the detected voltage output 11. Therefore, a resistor of which the resistance is set with a high accuracy should be used as the resistors R1 to R4.

Also, the detecting accuracy of te voltage detector 9 becomes lower proportionally to a higher common mode voltage. This will be explained with reference to FIG. 3.

Figure 3:
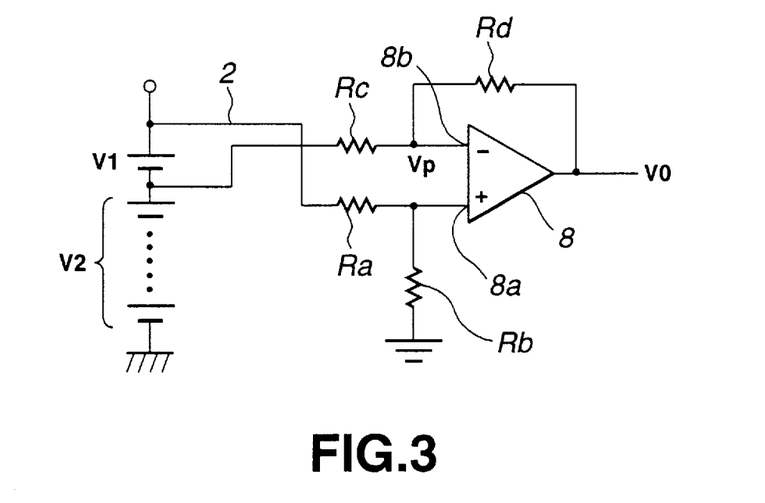
FIG. 3 is a circuit diagram to which the disadvantages of the conventional cell voltage detection circuit will be explained with reference.

The output Vo of the operational amplifier is simply expressed (offset error of the operational amplifier is neglected):

$$Vp=Rb(V1+V2)/(Ra+Rb)$$

where Vp:

Ra, Rb: Resistance of resistors R1 and R2
V1: Voltage of cell having highest voltage
V2: Total voltage of other cells Therefore, $$Vo=Vp-Rd(V2-Vp)/Rc$$

where Rc., Rd: Resistance of resistors R3 and R4

Assume that Ra=Rc and Rb=Rd     (1)

Then, $$Vo=Rd\cdot V1/Rc \quad (2)$$

When V1=OV, the output Vo of the operational amplifier should be O. Actually, however, V1 will not be OV because of the error due to the common mode voltage at the operational amplifier.①

The expression (1) is not practically possible. When the expression (1) is impossible, the output Vo of the operational amplifier has an error proportional to a voltage V2.②

These errors ① and ② cause to low the detecting accuracy of the cell voltage detection circuit.

Further, since in the conventional cell voltage detection circuit shown in FIG. 2 needs one cell voltage detector 9 for each cell, it is much complicated.

SUMMARY OF THE INVENTION

It is therefore an object of the present invention to provide a cell voltage detection circuit simplified in construction and capable of detecting a voltage of each of the cells in a battery with a high accuracy The above object can be attained by providing a cell voltage detection circuit for a plurality of cells connected in series to each other in a battery and adapted to detect a voltage of each cell, comprising, according to the present invention, a first input selecting means connected to positive and negative electrodes of each cell to select either the positive or negative electrode of a selected cell and acquire a voltage of the cell;

a second input selecting means connected to the positive and negative electrodes of each cell to select either the positive or negative electrode of the selected cell and acquire a voltage of the cell;

a voltage detecting means for acquiring a detected output voltage from output voltages from the first and second input selecting means; and a processing means for converting the detected cell output voltage from the voltage detecting means from analog to digital for calculation to thereby determine the voltage of the individual cell.

According to the present invention, to detect the voltage of each of the plurality of cells connected in series to each other in a battery, the positive and negative electrodes of the cell are connected to the first input selecting means to select either the positive or negative electrode of a selected cell and acquire the voltage of the selected cell. Also the positive and negative electrodes of the cell are connected to the second input selecting means to select the positive or negative electrode of a selected cell and acquire the voltage of the selected cell.

The voltage detecting means is adapted to acquire a detected cell output voltage from a first cell output voltage from the first input selecting means and a second cell output voltage from the second input selecting means.

The processing means converts the detected cell output voltage from the voltage detecting means from analog to digital for calculation to thereby determine the voltage of the individual cell.

Therefore, it is not necessary to provide a voltage detecting means for each of the plurality of cells. Each of the cells is selected by a single voltage detecting means and an output voltage detected by the voltage detecting means is converted from analog to digital for calculation to determine the voltage of each cell. Thus since a plurality of voltage detecting means may not be provided corresponding to the plurality of cells connected in series to each other, the voltage detection circuit can be simply constructed.

The voltage detection circuit according to the present invention can also be used to detect a voltage of a single cell.

According to the present invention, the voltage detection circuit should preferably comprise a noninverting input terminal and an inverting input terminal, an operational amplifier, and a plurality of adjusting resistors provided for the operational amplifier. The processing means comprises an analog/digital converter to convert a detected output voltage from analog to digital, and an arithmetic unit to calculate the digital signal to provide a voltage of each cell. Thus, the detected output voltage from the voltage detecting means can be digitally calculated by the processing means to determine the cell voltage.

According to the present invention, the first input selecting means should preferably be able to select and be connected to a ground potential and the second input selecting means should also preferably be able to select a positive-voltage calibrating voltage to which a cell voltage is calibrated with reference.

According to the present invention, the first input selecting means should preferably be able to select a positive voltage calibrating voltage to which a cell voltage is calibrated with reference and the second input selecting means should preferably be able to select and be connected to a ground potential.

Thus, the degree of the amplitude by the operational amplifier can be checked by comparison between the positive-voltage calibrating reference voltage applied to the noninverting terminal of the voltage detecting means via the first input selecting means, and the ground potential applied to the inverting tenninal of the voltage detecting means via the second input selecting means.

Also, the degree of the amplitude by the operational amplifier can be checked by comparison between the ground potential applied to the noninverting terminal of the voltage detecting means via the first input selecting means and the negative-voltage calibrating reference voltage applied to the inverting terninal of the voltage detecting means via the second input selecting means.

According to the present invention, the cell voltage detection circuit should preferably be adapted such that when a same electrode of a cell is selected by the first and second input selecting means and a common mode voltage is applied to the noninverting and inverting input terminals of the voltage detecting means, the resistance of the adjusting resistor provided for the voltage detecting means is set to provide an output voltage from the voltage detecting means, and the positive output voltage from the voltage detecting means is applied to the analog/digital converter of the processing means to provide an error of the voltage detecting means to which the common mode voltage is applied. Namely, when the common mode voltage is applied to the voltage detecting means, the latter will not provide a voltage of zero volt in practice, that is, the voltage from the voltage detecting means contains an error.

Thus, since the voltage detecting means always provides a positive detected output voltage, the analog/digital converter of the processing means is supplied with a positive cell output voltage, so that the range of voltage input to the analog/digital converter can be limited to a positive range of voltage. Therefore, the analog/digital converter may have a resolution within only a positive range of voltage, and it may not need a higher cost performance and can thus be manufactured with less costs than the analog/digital converter which must have both positive and negative ranges of voltage.

According to the present invention, the cell voltage detection circuit should preferably be adapted such that the positive terminal of a cell is connected to the noninverting input terminal of the voltage detecting means via the first input selecting means and the negative terminal of the cell is connected to the inverting input terminal of the voltage detecting means via the second input selecting means. Thus, a voltage of a cell can be correctly detected while being calibrated.

The above object can also be attained by providing a method of detecting a voltage of each of a plurality of cells connected in series to each other in a battery by a cell voltage detection circuit comprising: a first input selecting means connected to positive and negative electrodes of each cell to select either the positive or negative electrode of a selected cell and acquire a voltage of the cell; a second input selecting means connected to the positive and negative electrodes of each cell to select either the positive or negative electrode of the selected cell and acquire a voltage of the cell;

a voltage detecting means for acquiring a detected output voltage from output voltages from the first and second input selecting means; and a processing means for converting the detected cell output voltage from the voltage detecting means from analog to digital for calculation to thereby provide the voltage of the individual cell, the method comprising, according to the present invention, the steps of:

selecting an input to the first input selecting means and an input to the second input selecting means to supply from the voltage detecting means a positive detected output voltage to the analog/digital converter of the processing means and calculate an amplification factor of the voltage detecting means based on a known calibrating reference voltage connected to either the first or second input selecting means;

supplying a common mode voltage from a same electrode of a cell to the voltage detecting means via the first and second input selecting means to acquire a first positive detected output voltage indicative of an error due to the common mode voltage supplied to the voltage detecting means;

supplying to a noninverting input terminal of the voltage detecting means a voltage at the positive cell electrode selected by the first input selecting means and to an inverting input terminal of the voltage detecting means a negative cell voltage selected by the second input selecting means, to acquire a second positive detected output voltage; and calculating as follows by the processing means to determine a cell voltage:

Voltage $E$=(second detected output voltage−first detected output voltage)/voltage amplification factor According to the present invention, at the voltage amplification factor calculating step, an input to the first input selecting means and an input to the second input selecting means are selected to supply from the voltage detecting means a positive detected output voltage to the analog/digital converter of the processing means and calculate an amplification factor of the voltage detecting means based on a known calibrating reference voltage.

At the first detected output voltage acquiring step, a common mode voltage is supplied from a same electrode of a cell to the voltage detecting means via the first and second input selecting means to acquire a first positive detected output voltage indicative of an error due to the common mode voltage supplied to the voltage detecting means.

At the second detected output voltage acquiring step, a voltage at the positive cell electrode is selected by the first input selecting means and supplied to a noninverting input terminal of the voltage detecting means, and a negative cell voltage is selected by the second input selecting means and supplied to an inverting input terminal of the voltage detecting means, to acquire a second positive detected output voltage.

At the cell voltage detecting step, the processing means calculates as follows to determine a cell voltage:

Voltage $E$=(second detected output voltage−first detected output voltage)/voltage amplification factor In this way, the cell voltage can be detected accurately and simply irrespectively of the accuracy of the resistors, for example, in the voltage detecting means.

According to the present invention, at the step where a common mode voltage is supplied from a same electrode of a cell to the voltage detecting means via the first and second input selecting means to acquire a first positive detected output voltage indicative of an error due to the common mode voltage supplied to the voltage detecting means, the resistance of the plurality of resistors of the voltage detecting means is set such that the detected output voltage of the voltage detecting means, supplied to the analog/digital converter of the processing means, is always a positive voltage.

Thus, since the voltage detecting means always provides a positive detected output voltage to the analog/digital converter of the processing means, the range of voltage input to the analog/digital converter can be limited to a positive range of voltage. Therefore, the analog/digital converter may have a resolution within only a positive range of voltage, and it may not need a higher resolution and can thus be manufactured with less costs than the analog/digital converter which must have both positive and negative ranges of voltage.

These objects and other objects, features and advantages of the present intention will become more apparent from the following detailed description of the preferred embodiments of the present invention when taken in conjunction with the accompanying drawings.

DETAILED DESCRIPTION OF THE PREFERRED EMBODIMENTS

It should be noted that the present invention is not limited to the embodiments of the present invention that will be described in the following.

Figure 4:
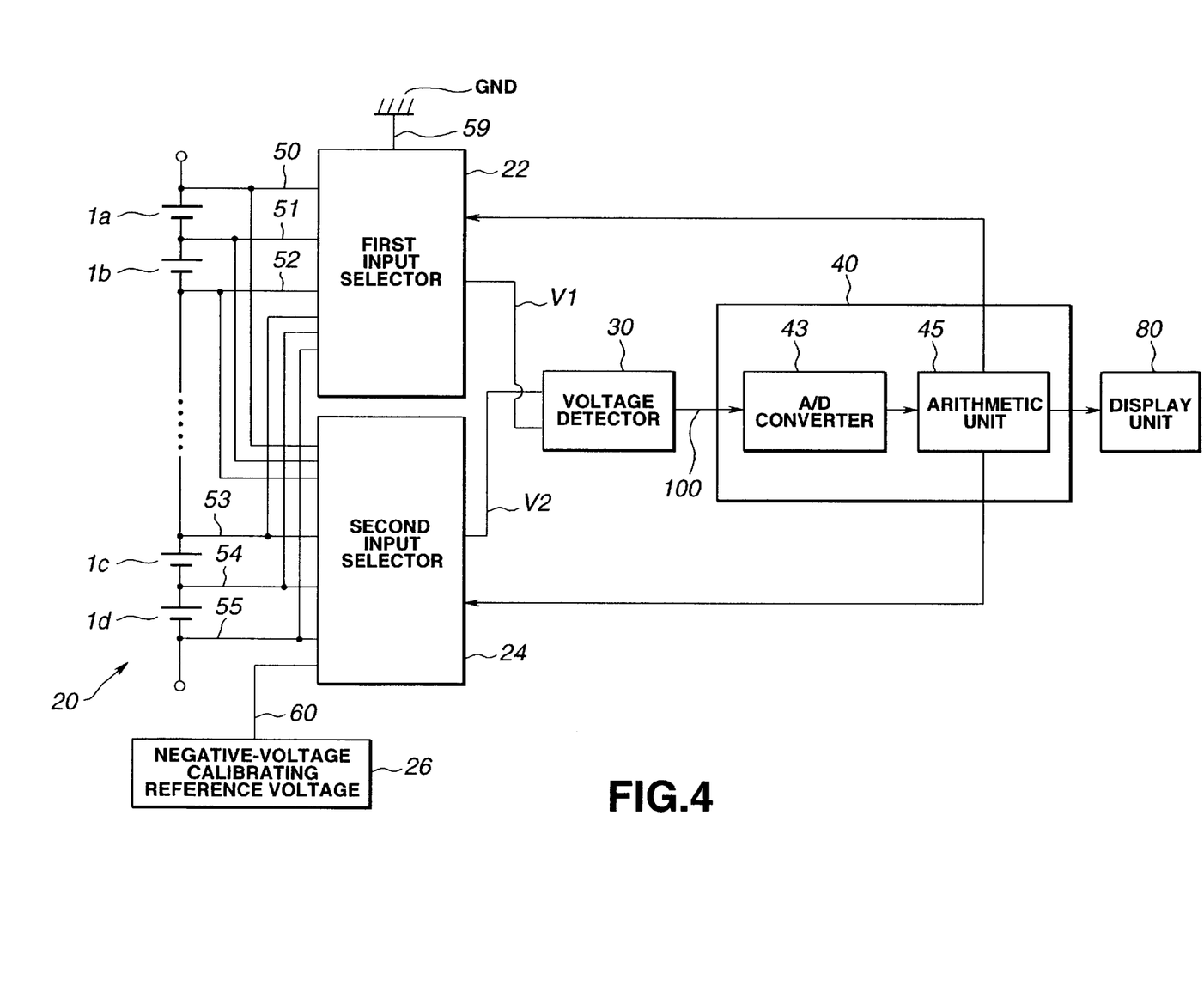
FIG. 4 is a block diagram of a preferred embodiment of the cell voltage detection circuit according to the present invention.

FIG. 4 illustrates, in the form of a block diagram, the first preferred embodiment of the cell voltage detection circuit according to the present invention for a battery in which a plurality of cells is connected in series to each other and adapted to detect a voltage of each cell.

In FIG. 4, the cell voltage detection circuit is generally indicated with a reference 20. The voltage detection circuit is adapted to detect a voltage of each of a plurality of cells 1*a* to 1*d* such as lithium ion cell or nickel cadmium cell.

Of these cells connected in series to each other, a one indicated with the reference 1*a* has a highest potential, while a one indicated with the reference 1*d* has a lowest potential. Therefore, the cell potential is lower in the order of the cells 1*a* to 1*d*.

To measure the voltage of each of the cells 1*a* to 1*d*, the cell voltage detection circuit 20 comprises a first input selecting means 22, second input selecting means 24, calibrating negative reference voltage or voltage source 26, cell voltage detector 30 and a processing means 40 as shown in FIG. 4.

The first and second input selecting means 22 and 24 are connected to the positive electrode of the cell 1*a* and negative electrode of the cell 1*d*, respectively.

Further, the first input selecting means 22 is connected to a ground potential GND and the second input selecting means 24 is connected to the calibrating negative reference voltage 26.

The first input selecting means 22 is electrically connected to the positive and negative electrodes of the cell with sense lines 50, 51, 52, 53, 54 and 55, respectively, and similarly the second input selecting means 24 is electrically connected to the positive and negative electrodes with sense lines 50, 51, 52, 53, 54 and 55, respectively.

The first input selecting means 22 can select either one of the sense lines 50 to 55 of each cell or a sense line 59 connected to GND and thus can be connected to the cell voltage detector 30. Similarly, the second input selecting means 24 can select either one of the sense lines 50 to 55 of each cell or a sense line 60 connected to the negative-voltage calibrating reference voltage 26 and thus can be connected to the voltage detector 30.

Figure 5:
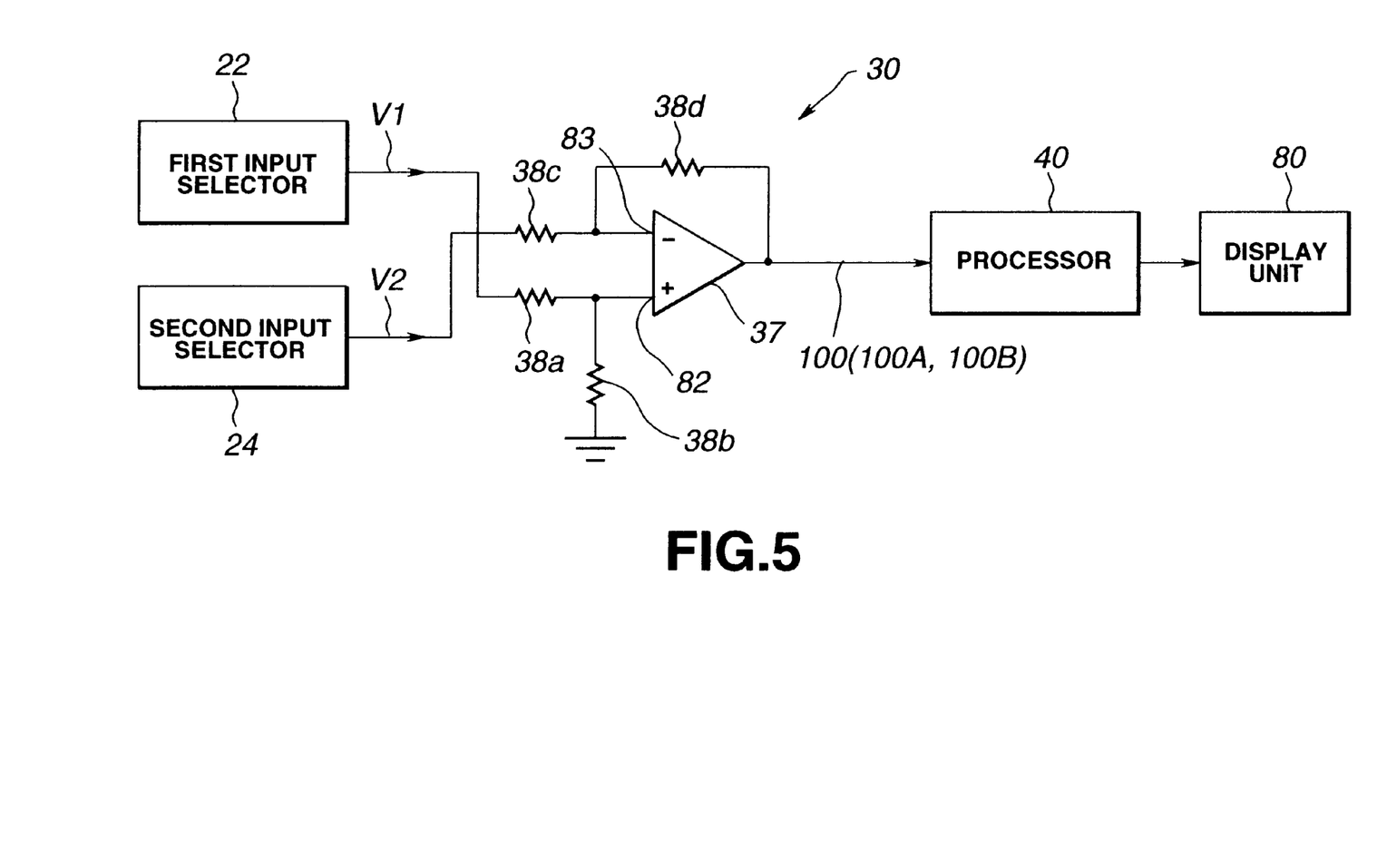
FIG. 5 is a circuit diagram of the voltage detecting means included in the cell voltage detection circuit in FIG. 4.

FIG. 5 is a circuit diagram of the voltage detector 30 included in the voltage detection circuit in FIG. 4. The voltage detector 30 comprises an operational amplifier 37 and four adjusting resistors 38*a* to 38*d*. The resistor 38*a* is connected between the first input selecting means 22 and a noninverting input terminal 82 of the operational amplifier 37. The resistor 38*c* is connected between the second input selecting means 24 and an inverting input terminal 83 of the operational amplifier 37.

The first input selecting means 22 provides a first output voltage V1 and the second input selecting means 24 provides a second output voltage V2, respectively, to the operational amplifier 37 in which the first and second output voltages V1 and V2 are subjected to a predetermined calculation to provide a detected output voltage 100 to the processing means 40.

In FIG. 4, the voltage detector 30 is connected to the processing means 40 which comprises an analog/digital converter (will be referred to as "A/D converter" hereinafter) 43 and an arithmetic unit 45 such as microcomputer.

The A/D converter 43 converts the detected output voltage 100 supplied from the voltage detector 30 from analog to digital and provides a digital value of the output voltage to the arithmetic unit 45.

The arithmetic unit 45 processes the supplied digital value in a predetermined manner to provide a voltage of each desired cell, namely, indicate it digitally on a display unit 80, for example. The display unit 80 may be a LC display panel, plasma display panel, CRT (cathode-ray tube) or a fluorescent character display tube. The display unit 80 can also deliver the detected cell voltage signal as an output to an external device.

Figure 7:
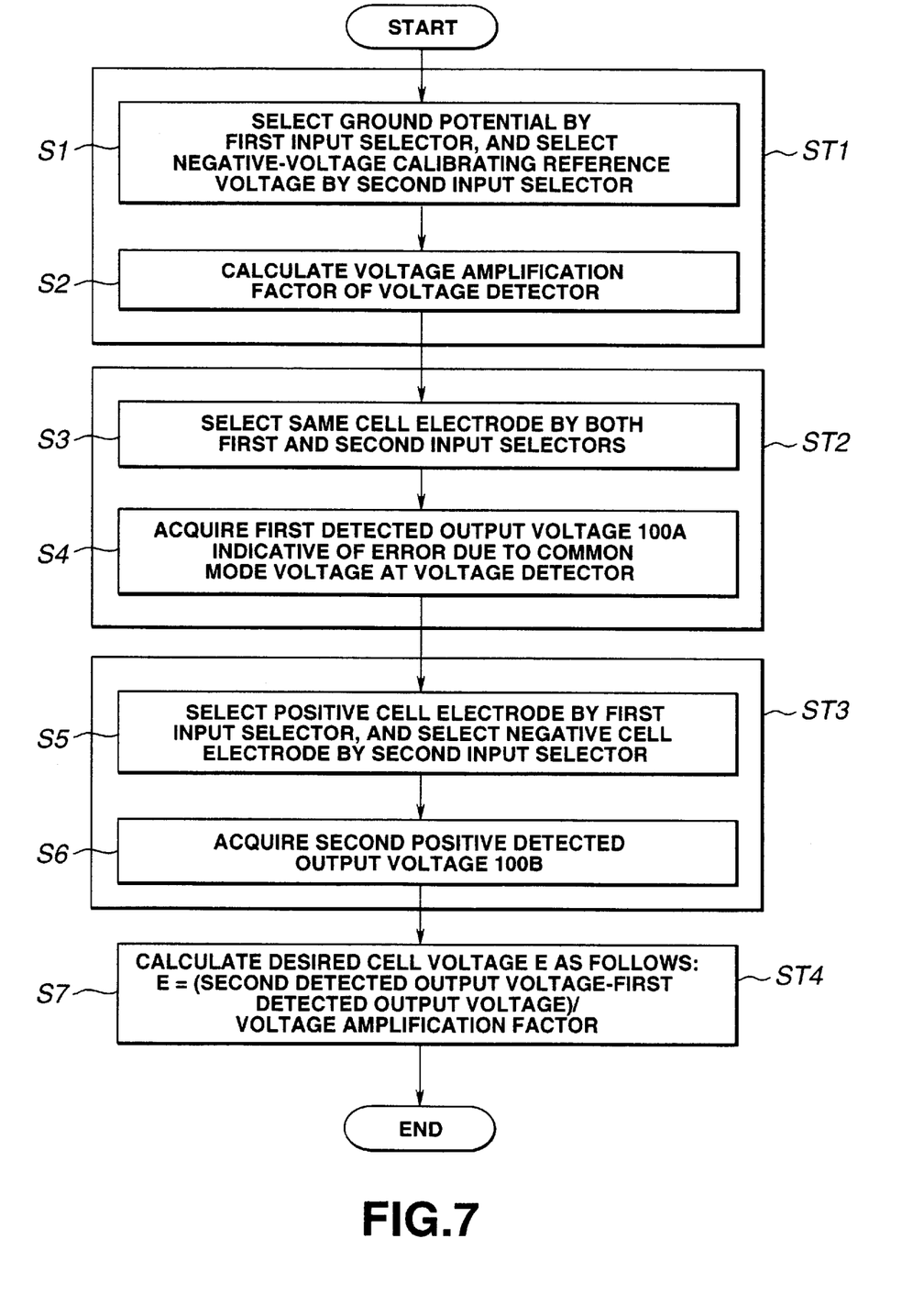
FIG. 7 is a flow chart of the cell voltage detection according to the present invention.

FIG. 7 is a flow chart of the cell voltage detection according to the present invention. It will be described herebelow with reference to FIG. 7 how the voltage of any one of the cells 1a to 1d shown in FIG. 4 is detected by the voltage detection circuit 20 according to the present invention.

At step ST1, a voltage amplification factor of the voltage detector 30 in FIG. 4 is calculated, and at step ST2, a first detected output voltage that is a positive voltage indicative of an error, due to a common mode voltage, of the voltage detector 30 is acquired. At step ST3, a second detected output voltage that is a positive voltage is acquired, and at step ST4, a cell voltage is calculated.

Step ST1 consists of two sub-steps S1 and S2.

At sub-step S1, the first input selecting means 22 selects the ground potential GND, while the second input selecting means 24 selects the negative-voltage calibrating reference voltage 26. Thus, the first input selecting means 22 supplies a first output voltage V1 of the ground potential (=0 V) to the noninverting input terminals 82 of the operational amplifier 37 in the voltage detector 30, while the second input selecting means 24 supplies a negative voltage from the negative-voltage calibrating reference voltage 26 as a second output voltage V2 to the inverting input terminals 83 of the operational amplifier 37.

Since the voltage from the negative-voltage calibrating reference voltage 26 is inverted at the inverting input terminal 83, the operational amplifier 37 will always provide a positive detected output voltage 100 to the A/D converter 43.

At sub-step S2, a proper amplification factor A of the voltage detector 30 is calculated beforehand by the arithmetic unit 45 in the processing means 40 on the assumption that the voltage from the negative-voltage calibrating reference voltage 26 is known.

The operation goes to the step ST2 in FIG. 7. This step ST2 consists of two sub-steps S3 and S4.

At sub-step S3, the first and second input selecting means 22 and 24 select a same cell electrode to receive a same input voltage. The first and second input selecting means 22 and 24 select only the sense line 50 in relation to the cell 1a to receive a positive voltage from the cell 1a as a common mode voltage. In this case, the first input selecting means 22 is not connected to GND while the second input selecting means 24 is not connected to the negative-voltage calibrating reference voltage 26.

At sub-step S4, a first detected output voltage 100A indicative of an error due to the common mode voltage at the voltage detector 30 is delivered to the A/D converter 43 of the processing means 40.

At sub-steps S3 and S4, a common mode voltage from a same cell can be supplied to the voltage detector 30 via the first and second input selecting means 22 and 24 to provide the first detected output voltage (preferably, positive voltage) indicative of the error due to the common mode voltage at the voltage detector 30.

Next, the operation goes to step ST3. Step ST3 consists of two sub-steps S5 and S6.

At sub-step S5, the first input selecting means 22 selects the positive electrode of the cell while the second input selecting means 24 selects the negative electrode of the cell. In this case, the first output voltage V1 of the first input selecting means 22 is supplied to the noninverting input terminal 82 of the operational amplifier 37 in the voltage detector 30 while the second output voltage V2 of the second input selecting means 24 is supplied to the inverting input terminal 83 of the operational amplifier 37.

At sub-step S6, the operational amplifier 37 of the voltage detector 30 calculates a second detected output voltage 100B from the voltages supplied at the inverting and noninverting input terminals 83 and 82 thereof. The second detected output voltage 100B is passed to the A/D converter 43 of the processing means 40, converted from analog to digital and sent to the arithmetic unit 45.

Thus at sub-steps S5 and S6, the first input selecting means 22 selects a positive cell electrode and supplies the voltage at the electrode to the noninverting input terminal 82 of the operational amplifier 37 of the voltage detector 30 and the second input selecting means 24 selects a negative cell electrode and supplies the voltage at the electrode to the inverting input terminal 83 of the operational amplifier 37, thereby providing a second positive detected output voltage 100B.

Based on the voltage amplification factor A of the voltage detector, determined at step ST1, first detected output voltage 100A determined at step ST2 and the second detected output voltage 100B determined at step ST3, the arithmetic unit 45 of the processing means 40 in FIG. 4 can calculate accurately and easily the voltage E of an intended cell 1a, for example, using the following expression:

$$E=(100B-100A)/A$$

Therefore, an error in resistance among the resistors 38a to 38d in FIG. 5 can be ignored, that is, an error due to difference in accuracy among the resistors in the voltage detector 30 can be canceled by the first detected output voltage 100A. Therefore, it is not necessary to use the resistors 38a to 38d which are expensive and of a high precision and the voltage of each cell can be detected accurately and easily.

At the step ST3, when the first input selecting means 22 selects a positive cell electrode while the second input selecting means 24 selects a negative cell electrode, the first output voltage V1 from the first input selecting means 22 is supplied to the noninverting input terminal 82 of the operational amplifier 37 in the voltage detector 30 while the second output voltage V2 from the second input selecting means 24 is supplied to the inverting input terminal 83 of the operational amplifier 37. Thus, since the voltages acquired via the inverting and noninverting input terminals 83 and 82 are always positive, the second detected output voltage 100B is also always positive. Therefore, since the second detected output voltage 100B is acquired into the A/D converter 43 in the processing means 40, the range of input to the A/D converter 43 may always be positive.

On the other hand, since same cell electrodes (positive or negative) are selected by the first and second input selecting means 22 and 24 to acquire an error due to the common mode voltage, the first detected output voltage 100A from the voltage detector 30 is negative as the case may be due to a variation in resistance of the resistors 38a to 38d.

To cope with the negative voltage, the range of input to the A/D converter 30 has to be both positive and negative voltages, and thus the A/D converter 30 should have a wider input range of voltage. Therefore, the A/D converter 30 should have a higher resolution and thus will be expensive.

For a n A/D converter 43 having not so high a resolution and thus not so expensive, the voltage detector 30 according to the present invention employs the resistors 38a to 38d each having such a resistance that the first detected output voltage 100A of the voltage detector 30 is positive, to meet the following requirement:

$$\frac{R_{38b}}{R_{38a} + R_{38b}} > \frac{R_{38d}}{R_{38c} - R_{38d}}$$

where $R_{38a}$ is the resistance of the resistor 38a, $R_{38b}$ is the resistance of the resistor 38b, $R_{38c}$ is the resistance of the resistor 38c and the $R_{38d}$ is the resistance of the resistor 38d.

Figure 6:
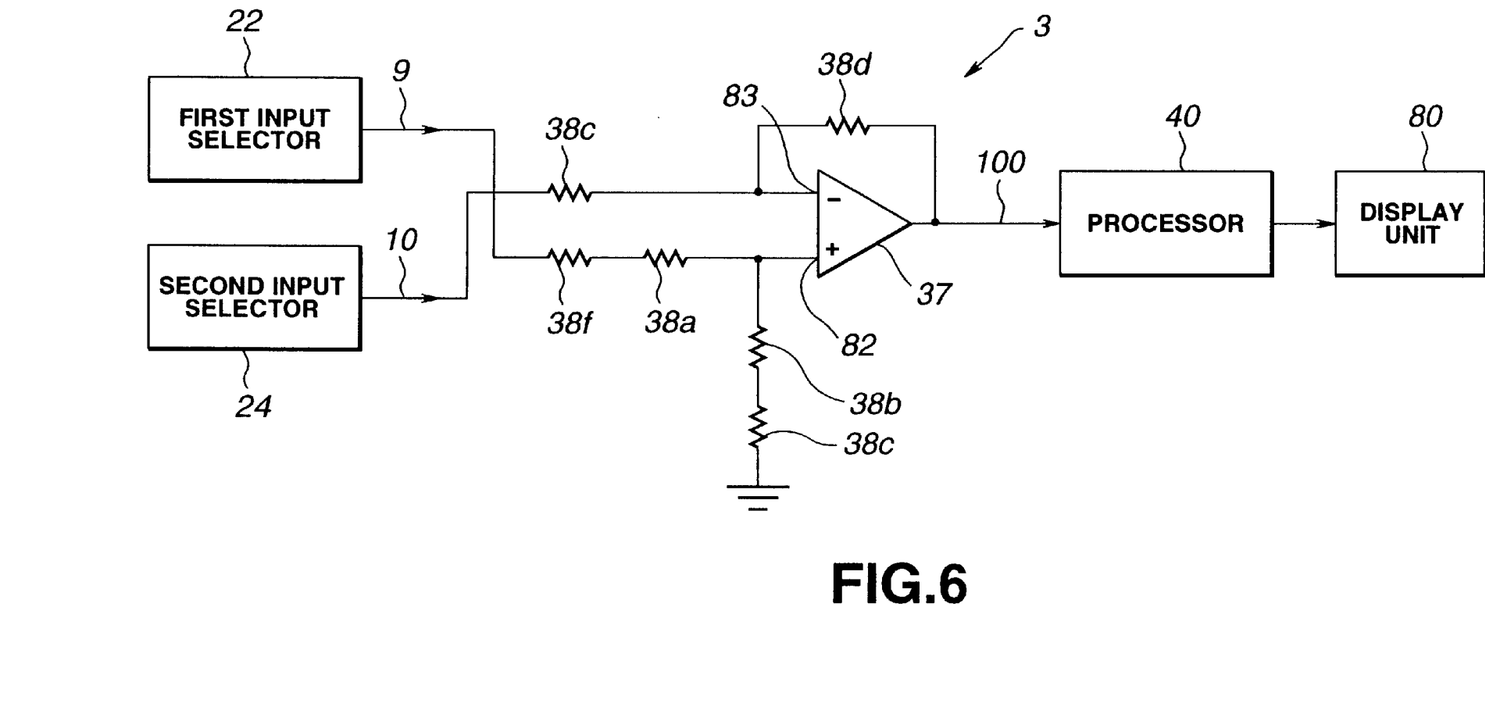
FIG. 6 is a circuit diagram of another preferred embodiment of the cell voltage detection circuit according to the present.

To meet the above requirement, additional resistors 38e and 38f should preferably be provided for combination with the existing ones 38a to 38d as shown in FIG. 6. Of course, the resistors may be combined in any other manner than shown in FIG. 6.

Since the calibrating reference voltage 26 is used while the range of input to the A/D converter 43 is always positive as having been described in the foregoing, the range of input to the A/D converter 43 of the processing means 40 can be only positive and thus the processing means 40 can be rather simplified in construction and thus be inexpensive.

Figure 8:
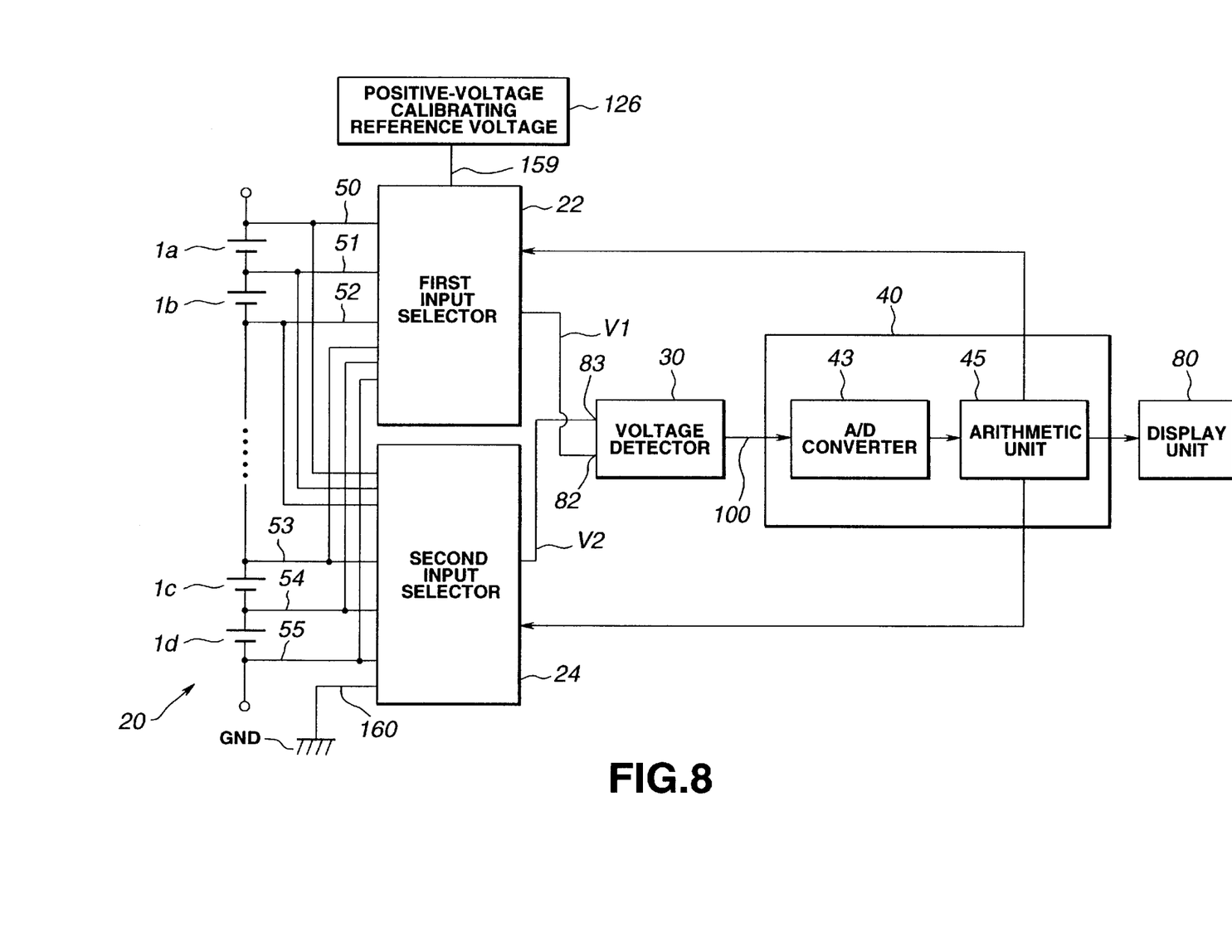
FIG. 8 is a circuit diagram of still another preferred embodiment of the cell voltage detection circuit according to the present invention.

FIG. 8 is a circuit diagram of the fifth preferred embodiment of the cell voltage detection circuit according to the present invention. The cell voltage detection circuit 20 in FIG. 8 is similar to that shown in FIG. 4 provided that the first input selecting means 22 can select and be connected to a positive-voltage calibrating reference voltage 126 via a sense line 159 and the second input selecting means 24 can selected and be connected to the ground potential GND via a sense line 160.

Thus, the positive-voltage calibrating reference voltage 126 supplied to the noninverting input terminal 82 of the operational amplifier 37 in the voltage detector 30 via the first input selecting means 22 can be compared with the ground potential GND supplied to the inverting input terminal 83 of the operational amplifier 37 in the voltage detector 30 via the second input selecting means 24 to check the amplification degree of the operational amplifier 37 of the voltage detector 30.

The rest of the voltage detector 30 in FIG. 8 is similar to that in FIG. 4 and so will no longer be described.

It should be noted that the present invention is not limited to the preferred embodiments having been described in the foregoing.

The aforementioned embodiments of the present invention use so-called cell. However, the voltage detection circuit according to the present invention can be adapted to detect a voltage of each of a plurality of batteries each including a plurality of cells connected in series to each other.

The voltage detector (including the operational amplifier, etc.) can detect voltages of the plurality of cells and thus the circuit calibration can be simplified and the voltage detector may be inexpensive.

An arithmetic unit such as microcomputer is used to calculate the proper amplifier factor of the voltage detector 30 and also measure an error due to the common mode voltage at the voltage detector 30, so that the cell voltage can be corrected based on the measured error. Therefore, the operational amplifier 37 in the voltage detector 30 and resistors provided for the operational amplifier 37 may not be of so high a precision.

The voltage detection accuracy of the voltage detection circuit 20 is not influenced by a voltage of each cell, time change of the voltage detector 30 and temperature variation, so it is possible to measure the voltage of each cell.

Since the range of input voltage to the A/D converter can be limited to a positive one, the resolution of the A/D converter can be determined only with the resolution of the cell voltage. If it is necessary to determine both ranges of positive and negative input voltages to the A/D converter, a 2 bits higher resolution, for example, is required.

To detect a voltage of each of a plurality of cells connected in series to each other, the embodiment of the present invention comprises the first and second input selecting means, voltage detector, A/D converter, arithmetic unit and calibrating reference voltage 26. The range of input voltage to the A/D converter can be limited to a positive one.

It should be noted that the sequence of the steps ST1, ST2 and ST3 for voltage detection is not limited to this order but they may be swapped between them except for the step ST4 which is to be done finally.

What is claimed is:

1. A cell voltage detection circuit for a plurality of cells connected in series to each other in a battery and adapted to detect a voltage of each of the cells, comprising:

a first input selecting means connected to positive and negative electrodes of each cell to select either the positive or negative electrode of a selected cell and acquire a voltage of the cell;

a second input selecting means connected to the positive and negative electrodes of each cell to select either the positive or negative electrode of the selected cell and acquire a voltage of the cell;

a voltage detecting means for acquiring a detected output voltage from output voltages from the first and second input selecting means, wherein the voltage detecting means comprises an operational amplifier and a plurality of resistor provided for the operational amplifier, the operational amplifier having a noninverting input terminal connected to the first input selecting means and an inverting input terminal connected to the second input selecting means; and a processing means for converting the detected cell output voltage from the voltage detecting means from analogue to digital for calculating to thereby determine the voltage of the individual cell, wherein the processing means comprises an analogue/digital converter to convert a detected output voltage of a cell from an analog to digital, and an arithmetic unit which calculates a digital output from the analog/digital converter to provide a voltage of each cell.

2. The cell voltage detection circuit as set forth in claim 1, wherein the battery is a cell.

3. The cell voltage detection circuit as set forth in claim 1, wherein the first input selecting means can select and be connected to a ground potential, and the second input selecting means can select and be connected to a negative reference voltage for calibration of the cell voltage.

4. The cell voltage detection circuit as set forth in claim 3, wherein when a same electrode of a cell is selected by the first and second input selecting means and a common mode voltage is applied to the noninverting and inverting input terminals of the voltage detecting means, the resistance of a plurality of adjusting resistors provided for the voltage detecting means is set to provide an output voltage from the voltage detecting means and the positive output voltage from the voltage detecting means is applied to the analog/digital conveoer.

5. The cell voltage detection circuit as set forth in claim 4, wherein the positive electrode of the cell is connected to the noninverting input terminal of the voltage detecting means via the first input selecting means, and the negative electrode of the cell is connected to the inverting input terminal of the voltage detecting means via the second input selecting means.

6. The cell voltage detection circuit as set forth in claim 1, wherein the first input selecting means can select and be connected to a positive reference voltage for calibration of the cell voltage, and the second input selecting means can select and be connected to a ground potential.

7. A method of detecting a voltage of each of a plurality of cells connected in series to each other in a battery by a cell voltage detection circuit comprising a first input selecting means connected to positive and negative electrodes of each cell to select either the positive or negative electrode of a selected cell and acquire a voltage of the cell; a second input selecting means connected to the positive and negative electrodes of each cell to select either the positive or negative electrode of the selected cell and acquire a voltage of the cell; a voltage detecting means for acquiring a detected output voltage from output voltages from the first and second input selecting means; and a processing means for converting the detected cell output voltage from the voltage detecting means from analog to digital for calculation to thereby determine the voltage of the individual cell, the method comprising the steps of:

selecting an input to the first input selecting means and an input to the second input selecting means to supply from the voltage detecting means a positive detected output voltage to the analog/digital converter of the processing means and calculate an amplification factor of the voltage detecting means based on a known calibrating reference voltage connected to either the first or second input selecting means;

supplying a common mode voltage from a same electrode of a cell to the voltage detecting means via the first and second input selecting means to acquire a first positive detected output voltage indicative of an error due to the common mode voltage supplied to the voltage detecting means;

supplying to a noninverting input terminal of the voltage detecting means a voltage at the positive cell electrode selected by the first input selecting means and to an inverting input terminal of the voltage detecting means a negative cell voltage selected by the second input selecting means, to acquire a second positive detected output voltage; and calculating as follows by the processing means to determine a cell voltage:

Voltage $E$=(second detected output voltage−first detected output voltage)/voltage amplification factor.

8. The method as set forth in claim 7, wherein at the step where a common mode voltage is supplied from a same electrode of a cell to the voltage detecting means via the first and second input selecting means to acquire a first positive detected output voltage indicative of an error due to the common mode voltage supplied to the voltage detecting means, the resistance of the plurality of resistors of the voltage detecting means is set such that the detected output voltage of the voltage detecting means, supplied to the analog/digital converter of the processing means, is always a positive voltage.

9. The method as set forth in claim 7, wherein the battery is a cell.

10. A circuit to detect a voltage of at least one cell in a battery, the circuit comprising:

a first input selector adapted to be coupled to a positive and negative electrode of each cell;

a second input selector adapted to be coupled to a positive and negative electrode of each cell;

a voltage detector having a noninverting input terminal connected to the first input selector and an inverting input terminal connected to the second input selector; and a processor having an analogue/digital converter coupled to the voltage detector and an arithmetic unit coupled to the analogue/digital converter.

11. The circuit of claim 10, wherein the voltage detector further includes an operational amplifier having a plurality of resistors.

12. The circuit of claim 10, wherein the first input selector is coupled to a ground potential and the second input selector is coupled to a negative reference voltage.

13. The circuit of claim 12, wherein the first input selector is electrically coupled to a ground potential and the second input selector is electrically coupled to a negative reference voltage.

14. The circuit of claim 10, wherein the first input selector is coupled to a positive reference voltage and the second input selector is coupled to a ground potential.

15. The circuit of claim 14, wherein the first input selector is electrically coupled to a positive reference voltage and the second input selector is electrically coupled to a ground potential.

* * * * *